United States Patent
Gallagher et al.

(10) Patent No.: US 7,826,038 B2
(45) Date of Patent: Nov. 2, 2010

(54) METHOD FOR ADJUSTING LITHOGRAPHIC MASK FLATNESS USING THERMALLY INDUCED PELLICLE STRESS

(75) Inventors: Emily F. Gallagher, Burlington, VT (US); Louis M. Kindt, Milton, VT (US); James A. Slinkman, Montpellier, VT (US); Richard E. Wistron, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 267 days.

(21) Appl. No.: 12/029,506

(22) Filed: Feb. 12, 2008

(65) Prior Publication Data

US 2008/0131795 A1 Jun. 5, 2008

Related U.S. Application Data

(62) Division of application No. 10/905,453, filed on Jan. 5, 2005, now Pat. No. 7,355,680.

(51) Int. Cl.
   *G03B 27/62* (2006.01)
   *G03F 9/00* (2006.01)

(52) U.S. Cl. .............................. 355/75; 430/5
(58) Field of Classification Search ............ 355/75, 355/53, 52, 30; 378/24, 25; 430/5, 20, 22, 430/30
   See application file for complete search history.

(56) References Cited

U.S. PATENT DOCUMENTS

| | | | |
|---|---|---|---|
| 4,973,283 A | 11/1990 | Adler et al. | |
| 5,327,808 A | 7/1994 | Nagata et al. | |
| 5,581,324 A | 12/1996 | Miyai et al. | |
| 6,440,619 B1 | 8/2002 | Feldman | |
| 6,623,893 B1 | 9/2003 | Levison et al. | |
| 6,653,024 B1 | 11/2003 | Shiraishi et al. | |
| 6,731,378 B2 | 5/2004 | Hibbs | |

(Continued)

FOREIGN PATENT DOCUMENTS

JP 4165354 6/1992

(Continued)

OTHER PUBLICATIONS

E.P. Cotte et al.; "Experimental and Numerical Studies of the Effects of Materials and Attachment Conditions on Pellicle-Induced Distortions in Advanced Photomasks;" Photomask and Next-Generation Lithography Mask Technology IX, Proceedings of SPIE vol. 4754 (2002); pp. 579-588.

*Primary Examiner*—Peter B Kim
(74) *Attorney, Agent, or Firm*—Cantor Colburn LLP; Richard Kotulak

(57) ABSTRACT

A method for adjusting the flatness of a lithographic mask includes determining an initial mask flatness of the mask, determining an applied stress for bringing the mask to a desired mask flatness, and determining a mounting temperature of a pellicle frame to be mounted to the mask, the mounting temperature corresponding to the applied stress. The actual temperature of the pellicle frame is adjusted to the determined mounting temperature, and the pellicle frame is mounted to the mask at the mounting temperature.

7 Claims, 5 Drawing Sheets

U.S. PATENT DOCUMENTS

| | | |
|---|---|---|
| 2003/0035222 A1 | 2/2003 | Okada et al. |
| 2003/0095245 A1 | 5/2003 | Mishiro et al. |
| 2003/0123042 A1 | 7/2003 | Laganza et al. |
| 2003/0197841 A1 | 10/2003 | Araki et al. |
| 2004/0125354 A1 | 7/2004 | Hibbs |
| 2005/0048376 A1 | 3/2005 | Eschbach et al. |

FOREIGN PATENT DOCUMENTS

| | | |
|---|---|---|
| JP | 9306832 | 11/1997 |
| JP | 2000195784 | 7/2000 |

METHOD FOR ADJUSTING LITHOGRAPHIC MASK FLATNESS USING THERMALLY INDUCED PELLICLE STRESS

CROSS REFERENCE TO RELATED APPLICATION

This application is a divisional application of U.S. application Ser. No. 10/905,453, filed Jan. 5, 2005, now U.S. Pat. No. 7,355,680, the contents of which are incorporated by reference herein in their entirety.

BACKGROUND

The present invention relates generally to semiconductor device processing techniques and, more particularly, to a method for adjusting lithographic mask flatness using thermally-induced pellicle stress.

Semiconductor fabrication techniques often utilize a mask or reticle in a conventional lithographic system to project an image onto a semiconductor wafer, wherein radiation is provided through (or reflected off) the mask or reticle, and passed through a focusing optical system to form the image (e.g., an integrated circuit pattern). The semiconductor wafer is positioned to receive the radiation transmitted through (or reflected off) the mask such that the image formed on the wafer corresponds to the pattern on the mask. The radiation source may be light, such as ultraviolet light, vacuum ultraviolet (VUV) light, extreme ultraviolet light (EUV) and deep ultraviolet light (DUV). In addition, the radiation may also be x-ray radiation, e-beam radiation, etc. Generally, the formed image is utilized on the wafer to pattern a layer of material, such as a photoresist material. The photoresist material, in turn, may be utilized to define doping regions, deposition regions, etching regions, or other structures associated with the manufacture of integrated circuits (ICs).

Reticle flatness has become increasingly important as lithographic focus windows shrink. A smaller process window is undesirable for semiconductor manufacturing where process drifts could shift the operating point away from the optimal dose and/or focus range. The smaller the process window, the more likely yield loss will occur when the process drifts. Mask non-flatness consumes some of the process window; for example, a typical specification for mask blank flatness is less than 2 microns. At this maximum allowable value, the resulting impact is about 175 nanometers (nm) at the wafer. However, this value is on the order of the entire focus budget for some critical mask levels. On the other hand, a reticle flatness of 0.5 microns or better corresponds to less than 30 nm impact at the wafer, which is more tolerable.

It is undesirable to rely solely on incoming substrate flatness to meet desired tolerances. Flatter masks are more expensive to order, and because they push technology limits, they are not always within the tight specification limits. Moreover, both mask processing and pellicle mounting processes contribute to adverse changes in flatness. A pellicle is a thin, optically-transparent membrane used to protect patterned photomask surfaces from contamination by airborne particles. Typically, the pellicle includes a metal (e.g., aluminum) frame having one or more of the walls thereof securely attached to a chrome side of the mask or reticle. The membrane is stretched across the metal frame and prevents the contaminants from reaching the mask or reticle. Since the particles that fall on the pellicle are out of focus, they do not distort the image printed on the wafer.

Unfortunately, the mounting of the pellicle frame can alter mask flatness by exerting mechanical stresses on the mask. For example, recent technical articles have described how pellicles can affect the shape of the mask as a function of initial pellicle flatness and temperature change (Cotte et al., *Experimental and Numerical studies of the Effects of Materials and Attachment Conditions on Pellicle-Induced Distortions in Advanced Photomasks*, SPIE Vol. 4754, pp. 579-588 (2002)).

Accordingly, it would be desirable to implement a pellicle mounting process wherein reticle flatness is not adversely affected and, even more advantageously, wherein existing reticle flatness may be improved following pellicle attachment.

SUMMARY

The foregoing discussed drawbacks and deficiencies of the prior art are overcome or alleviated by a method for adjusting the flatness of a lithographic mask. In an exemplary embodiment, the method includes determining an initial mask flatness of the mask, determining an applied stress for bringing the mask to a desired mask flatness, and determining a mounting temperature of a pellicle frame to be mounted to the mask, the mounting temperature corresponding to the desired applied stress. The actual temperature of the pellicle frame is adjusted to the determined mounting temperature, and the pellicle frame is mounted to the mask at the mounting temperature.

In another embodiment, an apparatus for adjusting the flatness of a lithographic mask includes a pellicle frame configured for mounting to the mask. The pellicle frame has a plurality of sides including a material having a selected coefficient of thermal expansion so as to induce a determined stress on the mask. The determined stress causes an initially measured mask flatness to be adjusted to a desired mask flatness.

BRIEF DESCRIPTION OF THE DRAWINGS

Referring to the exemplary drawings wherein like elements are numbered alike in the several Figures.

DETAILED DESCRIPTION

Disclosed herein is a method for improving photolithographic mask flatness through the use of thermally-induced pellicle stresses. Although the effects of pellicle attachment have heretofore been recognized as having a negative impact on mask flatness, the present invention embodiments affirmatively utilize the differences in temperature between the pellicle frame during mask mounting and the ambient temperature of the photolithographic mask to improve mask flatness.

Figure 1:
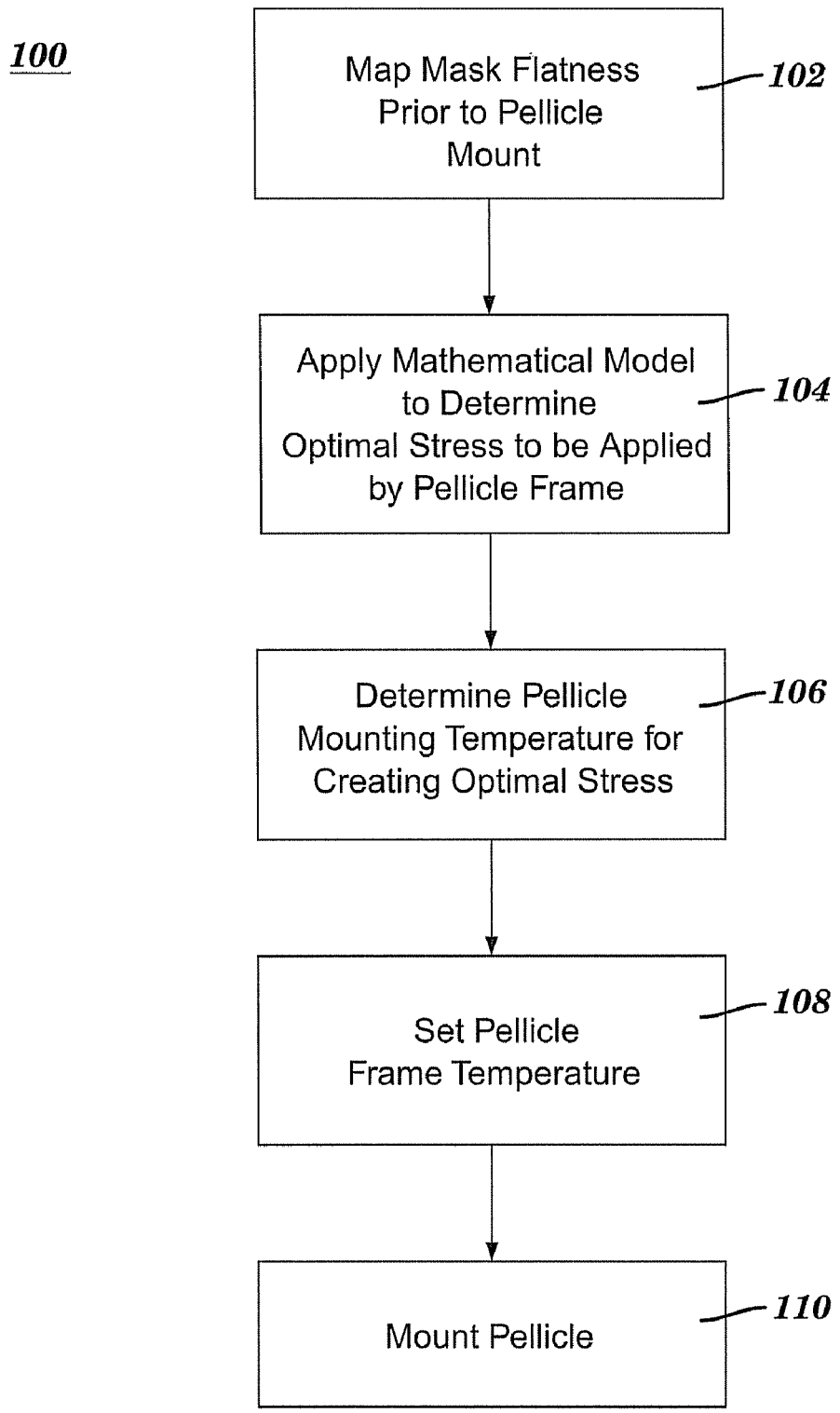
FIG. 1 is a block diagram illustrating a method for adjusting lithographic mask flatness using thermally induced pellicle stress, in accordance with an embodiment of the invention.

Referring initially to FIG. 1, there is shown a block diagram illustrating a method 100 for adjusting lithographic mask flatness using thermally induced pellicle stress, in accordance with an embodiment of the invention. As shown in block 102, the mask flatness of an individual mask is mapped, prior to mounting a pellicle frame thereon. In this manner, individual variations in flatness from mask to mask may be specifically compensated for. Then, as shown in block 104, a mathematical model is applied in order to determine an optimal stress (magnitude and direction) to be applied by the pellicle frame to the mask, in order to bring the mask to a desired degree of flatness.

Figure 2:
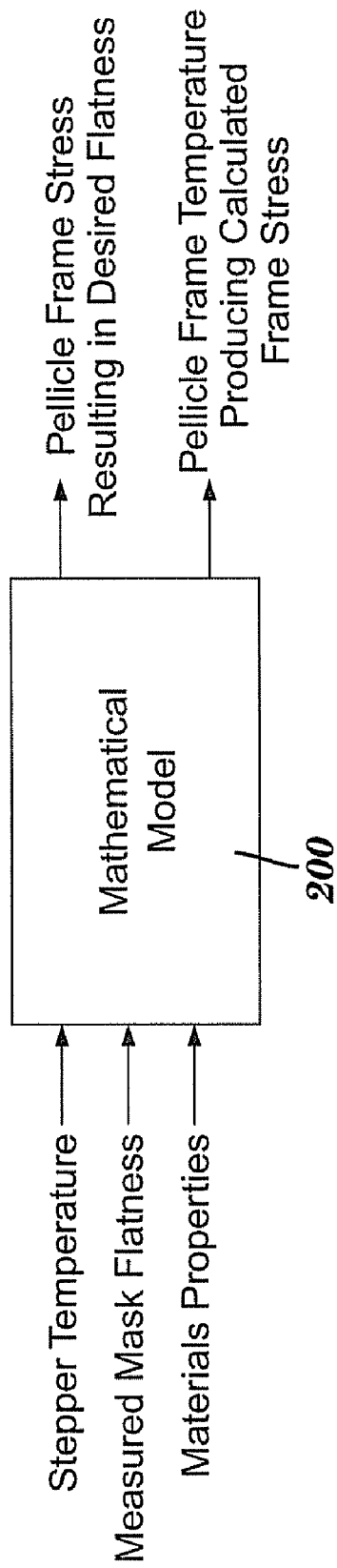
FIG. 2 is a schematic block diagram illustrating inputs and outputs of a mathematical model used in the method of FIG. 1.

Inputs to the mathematical model 200 (depicted schematically in FIG. 2) include stepper temperature, the mask flatness data determined in block 102 of FIG. 1, and the physical properties of the pellicle and mask materials. The physical properties used by the model include the elastic modulus, Poisson's ratio, coefficient of thermal expansion (CTE) and physical dimensions of the mask, pellicle frame and adhesive material used to attach the pellicle frame to the mask. The model 200 uses these inputs to determine a particular pellicle frame stress needed to result in a desired mask flatness. Depending on whether an expansive force or a contractive force is desired, the pellicle frame temperature will be changed with respect to stepper temperature. Thus, another output of model 200 is a calculated pellicle frame temperature that will result in the pellicle frame stress when the pellicle is mounted to the mask.

It should be noted at this point that the adhesive material is selected so as to efficiently transfer stress from the pellicle frame to the mask, and will thus have a relatively high elastic modulus (e.g., in excess of 1 MPa). One suitable example for such an adhesive would be an acrylic polymer.

Returning to FIG. 1, method 100 proceeds to block 106, wherein the pellicle (frame) mounting temperature for producing the optimal stress for desired mask flatness is determined. At block 108, the pellicle frame temperature is then set using a heating and/or cooling source. As described in further detail hereinafter, the application of stressing forces applied to the pellicle frame has multiple degrees of freedom, depending on the application of heating/cooling sources and/or physical characteristics of the frame itself. Then, once the desired pellicle frame temperature is verified, the pellicle is mounted to the mask at block 110.

Figure 3A:
FIGS. 3(*a*) through 3(*c*) depict an exemplary application of the method of FIG. 1.
Figure 3B:
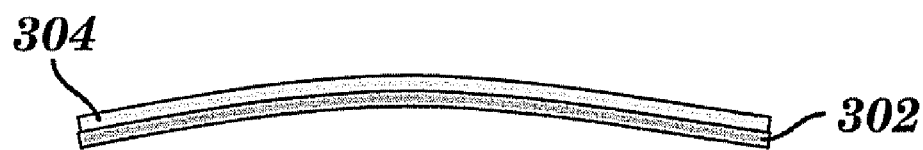
Figure 3C:

Because the coefficient of thermal expansion (CTE) for an aluminum pellicle frame is about 24 ppm/° C. while that for the quartz mask is about 0.6 ppm/° C., it will be appreciated that expansion or contraction of the pellicle frame may be used to intentionally alter the flatness of the mask. A schematic depiction of this effect is illustrated in FIGS. 3(*a*)-3(*c*). In FIG. 3(*a*), a cross-sectional view of a mask 302 is shown having non-ideal flatness such that the flatness measurements thereof reveal a convex shape. Upon application of the above described model, a certain pellicle frame mounting temperature is determined for the given mask such that the pellicle-mask system will result in a flatter mask after cooling to ambient temperature. In this instance, since the mask is measured to be convex, a "hot" pellicle temperature will be used, since the pellicle frame will contract upon cooling to the stepper temperature. Thus, as shown in FIG. 3(*b*), the heated pellicle frame 304 is mounted to the convex mask 302. Once the frame 304 begins to cool, the pulling contraction causes the mask 302 to become flatter, as shown in FIG. 3(*c*).

Conversely, it will be appreciated that for a concave mask, an attached "cold" pellicle frame will expand as it warms to the stepper temperature, thereby pushing the mask and correcting the concavity thereof. Because the CTE for Al is roughly 40 times that of quartz, the pellicle and mask could be processed at the same temperature, thereby simplifying implementation.

The exemplary data in the table of the first example presented below establishes the feasibility of such a procedure. In lieu of a quartz mask material, the initial flatness of a pair of 100 mm silicon wafers was mapped at room temperature (due to the availability of wafer flatness measuring equipment). Then, a pellicle frame was mounted to each wafer, one at room temperature and the other at an elevated temperature of 45° C. After cooling the high temperature pellicle frame, the flatness of the two wafers was once again mapped at room temperature:

EXAMPLE 1

| Initial wafer flatness range (max-mm) without pellicle (μm) | Temperature of pellicle during mounting (° C.) | Final wafer flatness range (max-mm) without pellicle (μm) | Change in wafer flatness (μm) |
|---|---|---|---|
| 6.9 | 20 | 7.3 | 0.4 |
| 7.4 | 45 | 21.2 | 13.8 |

As summarized in the table above, the pellicle frame mounted at room temperature had little effect on the initial wafer flatness (only about 0.4 microns), while the pellicle frame mounted at 45° C., and followed by cooling, altered the flatness of the wafer by almost twice its original value.

Once the desired pellicle frame temperature is determined, it could be achieved by controlling the temperature of the entire pellicle mounting tool and environment or, alternatively, by heating or cooling the pellicle frame directly. One suitable example of a heating method would be through electrical resistance (i.e., by passing an electric current through the frame). An example of a cooling method would be through thermal conduction by contacting the frame with a cold substance such as cold air or a cold solid. In implementing a temperature-changing mechanism, the actual pellicle frame temperature may be measured by contacting the frame with a measuring device such as a thermocouple or by viewing it with an infrared (IR) device. The ambient temperature near the frame could also be measured. Once the determined frame temperature has been attained, the pellicle frame is mounted to the mask. The temperature measurement could be fed back to the heating or cooling system to create a feedback loop to drive the system temperature to a set point.

The second example presented below establishes the feasibility of a 2-dimensional mathematical model (as described in FIG. 2) applied to a mask. In particular, mask deflection simulations were run using the standard, continuum model for thermal expansion of solid films of differing mechanical properties in two spatial dimensions (in cross-section for the embodiment herein). The constitutive equations for stress and deflection are discretized for numerical solution via the finite element method (as may be found in TSUPREM-4 User's Manual, Version 6.5, May 1997, pp. 2-95, Technology Modeling Associates, Inc. Sunnyvale, Calif., the contents of which are incorporated herein in their entirety. Values of mechanical properties for each film material were input from the literature, including the Cotte reference described above (e.g., Young's modulus, poisson ratio and thermal expansion coefficient).

Figure 4:
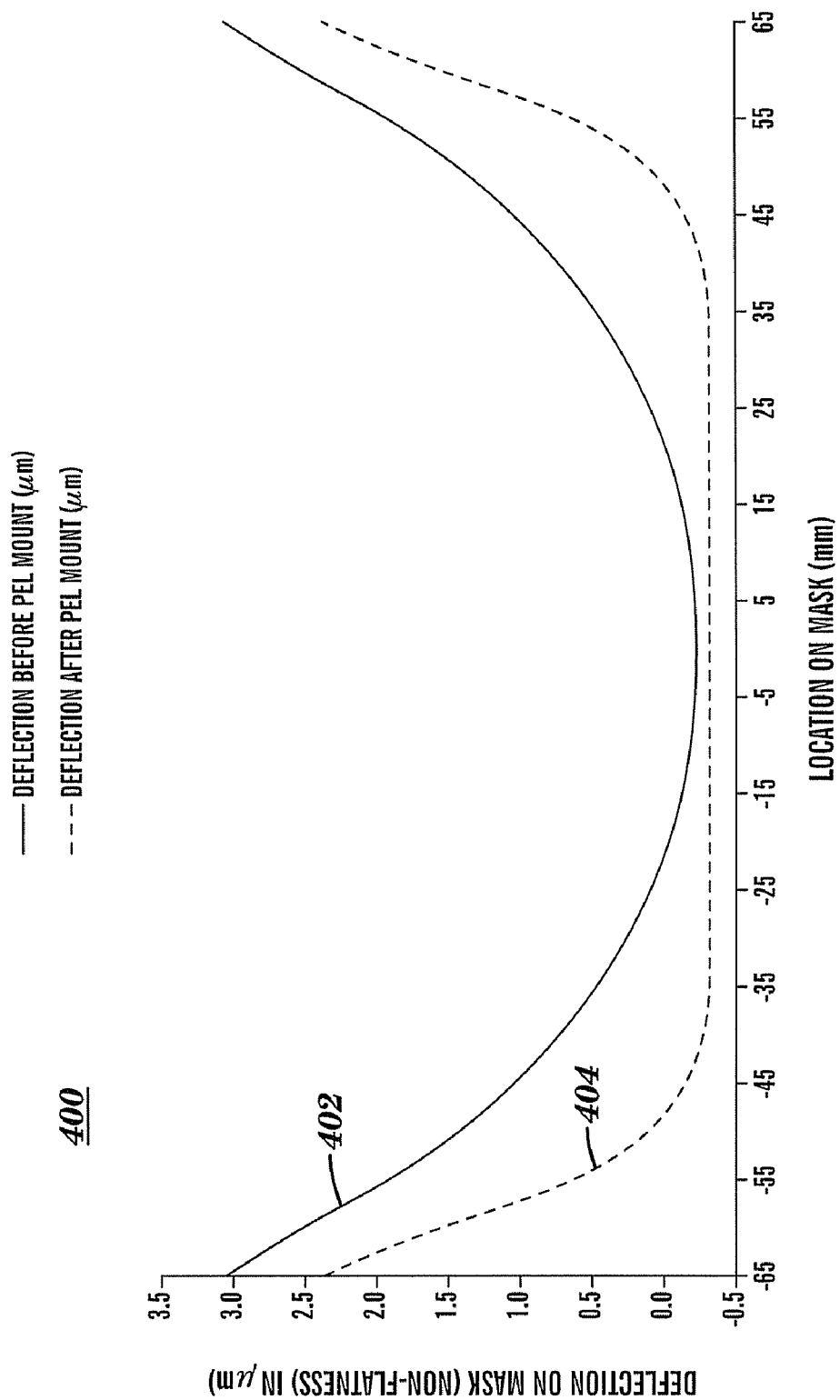
FIG. 4 is a graph illustrating mask flatness before and after adjustment by thermally-induced pellicle stress.

The initial non-flatness of the mask is depicted in the graph 400 of FIG. 4 by curve 402. A pellicle was mounted to the mask at a temperature that is about 20° C. below the temperature of the stepper. Once the pellicle/mask assembly warmed up to the stepper temperature, the pellicle frame expanded, thereby exerting a stress on the mask that improved the mask's flatness. Prior to the mounting of the pellicle, the deviation of the central 90 mm of the mask was about 1.2 μm, as shown by curve 402. However, after the pellicle was mounted to the mask and subsequently warmed up to the stepper temperature, the deviation of the central 90 mm of the mask improved to about 0.14 μm, as shown by curve 404 of FIG. 4. The material property inputs used by the mathematical model in determining applied pellicle frame stress and pellicle frame temperature are as follows:

EXAMPLE 2

Mask Material: quartz
Mask Dimensions: 152 mm×152 mm×6.3 mm
Mask Elastic modulus: 72.6 Gpa
Mask CTE: 0.55 ppm/° C.
Pellicle Frame (aluminum)
Pellicle Frame Dimensions: length=149 mm, span=122 mm, thickness=6.1 mm, width=2 mm
Pellicle Frame Elastic modulus: 72 Gpa
Pellicle Frame CTE: 23.6 ppm/° C.

It will be noted that in the above example, the mathematical model assumes that the adhesive is 100% effective in transferring stress from the pellicle frame to the mask.

Finally, in accordance with a further embodiment of the invention, FIGS. 5(a)-5(e) illustrate various pellicle frame configurations and materials that could be implemented, depending upon the specific initial flatness of the mask. Depending upon the outcome of the modeling process, it may be that the resulting pellicle frame temperature needed to bring the mask to the desired flatness is of such a value as to render the process impractical. As such, the physical characteristics of the pellicle frame itself may be adjusted in order change the stress versus temperature effects of the frame.

Figure 5A:
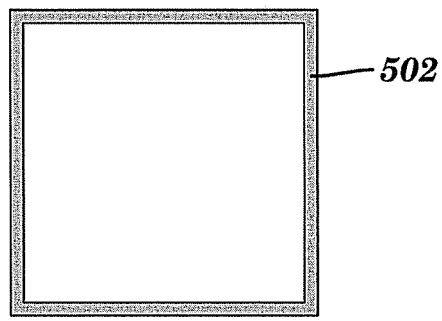
FIGS. 5(*a*) through 5(*f*) illustrate various pellicle frame configurations and materials, in accordance with a further embodiment of the invention.
Figure 5B:
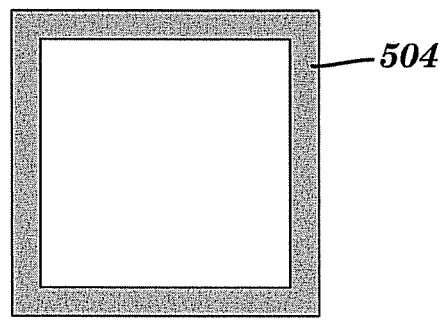
Figure 5C:
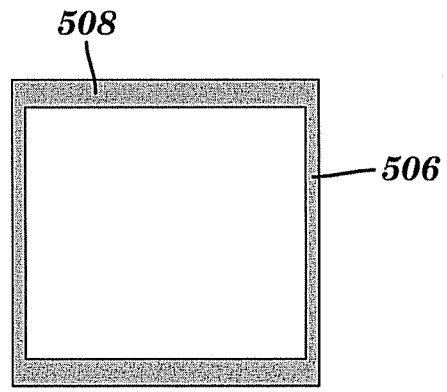

For example, if a greater stress is desired at a lower temperature, a pellicle frame 502 (FIG. 5(a)) having a standard frame thickness may be replaced with another pellicle frame 404 having an increased thickness, as shown in FIG. 5(b). Moreover, FIG. 5(c) illustrates a pellicle frame in which sides 506 along a first direction have a different thickness than sides 508 along a second direction. Each of the four sides could also have different thickness to further customize the amount and direction of the force applied to the frame by the mask. This results in an additional degree of freedom with respect to optimizing flatness in orthogonal directions.

Figure 5D:
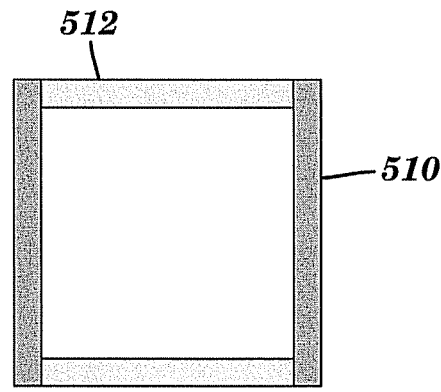
Figure 5E:
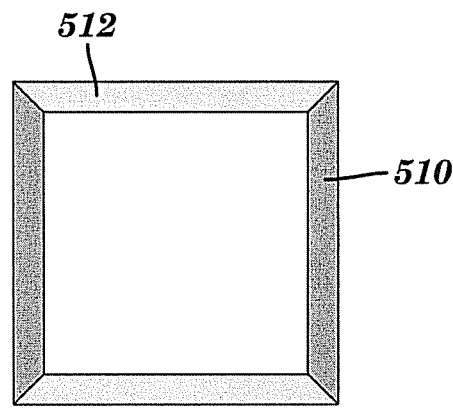

Still another alternative is to utilize a pellicle frame having materials with different coefficients of thermal expansion, such as shown in FIGS. 5(d) and 5(e). Whereas the sides 510 in one direction could be made of a material such as aluminum, the sides 512 disposed in the other direction may be made of another material such as quartz, for example, such that the stress applied in the x and y directions would be different. As is the case for tailored thickness, each of the four individual sides could also be made from different materials.

Figure 5F:
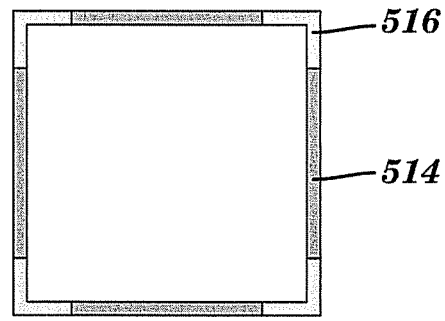

FIG. 5(f) illustrates a further pellicle frame embodiment, wherein a high CTE, electrically conductive material (e.g., aluminum) is used for each of the sides 514 of the frame, while an electrically and thermally insulating material is used at the corners 516 of the frame. Certain desirable properties of the corner material include: electrically and thermally insulating, compatibility with the pellicle adhesive, and non-particle generating. Thus configured, the temperature of each of the four sides 514 of the frame may be controlled independently, by individualized electrical resistance heating, for example. This again results in more degrees of freedom with respect to optimizing flatness.

It will further be appreciated that although the invention embodiments described herein are presented with respect to a pellicle frame attachment for mask flattening, it is contemplated that the principles are equally applicable to future generation masks and structures which do not specifically utilize a pellicle frame in the fabrication thereof.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. An apparatus for adjusting the flatness of a lithographic mask, comprising:
   a pellicle frame configured for mounting to the mask;
   said pellicle frame having a plurality of sides, at least a portion of which comprising a material having a different coefficient of thermal expansion with respect to the mask so as to provide one of an expansive force or a contractive force to the mask;
   wherein said one of an expansive force or a contractive force provided by said pellicle frame causes an initially measured mask flatness to be adjusted to a desired mask flatness.

2. The apparatus of claim 1, wherein said sides of said pellicle frame disposed in a first direction have a first thickness and said sides of said pellicle frame disposed in a second direction have a second thickness.

3. The apparatus of claim 1, wherein said sides of said pellicle frame disposed in a first direction comprise first material and said sides of said pellicle frame disposed in a second direction comprise a second material having a different coefficient of thermal expansion than said first material.

4. The apparatus of claim 1, wherein said first material is aluminum and said second material is quartz.

5. The apparatus of claim 1, wherein said sides of said pellicle frame comprise an electrically conductive material and corners of said pellicle frame comprise a thermally insulating material.

6. The apparatus of claim 5, wherein said sides of said pellicle frame are configured to be heated by passing an electrical current therethrough.

7. The apparatus of claim 6, wherein said sides of said pellicle frame are electrically insulated from one another.

* * * * *